United States Patent

Chen et al.

Patent Number: 5,923,203
Date of Patent: Jul. 13, 1999

[54] CMOS SOFT CLIPPER

[75] Inventors: Xiaole Chen, Milpitas; Roger Levinson, Sunnyvale, both of Calif.

[73] Assignee: Exar Corporation, Fremont, Calif.

[21] Appl. No.: 08/825,785

[22] Filed: Apr. 8, 1997

[51] Int. Cl.$^6$ .................. H03K 5/08; H03L 5/00
[52] U.S. Cl. .................. 327/318; 327/103; 327/404; 327/322
[58] Field of Search .................. 327/309, 313, 327/315, 318, 327, 328, 321, 323, 103, 104, 403, 404, 405, 322; 330/124 R, 51, 2

[56] References Cited

U.S. PATENT DOCUMENTS

| | | | |
|---|---|---|---|
| 4,506,113 | 3/1985 | Blomley | 327/309 |
| 4,877,981 | 10/1989 | Gomes | 327/318 |
| 5,350,956 | 9/1994 | Gronroos | 327/311 |
| 5,525,928 | 6/1996 | Asakawa | 327/316 |
| 5,530,399 | 6/1996 | Chambers et al. | 327/103 |
| 5,701,099 | 12/1997 | Shafir | 327/103 |

*Primary Examiner*—Timothy P. Callahan
*Assistant Examiner*—Terry L. Englund
*Attorney, Agent, or Firm*—Townsend and Townsend and Crew LLP

[57] ABSTRACT

A soft clipper circuit in CMOS technology not only allows the knee to be programmed, but also the slope of the curve after the knee to be programmed. This is accomplished by putting a second transconductance in parallel with the first transconductance, and using a switching circuit to connect the output of the second transconductance to that of the first transconductance when the knee level is reached. This is determined by a comparator which has an input coupled to the second transconductance and controls a control node of the switching circuit.

13 Claims, 3 Drawing Sheets

CMOS SOFT CLIPPER

BACKGROUND OF THE INVENTION

The present invention relates to clipper circuits, and in particular to a clipper in CMOS technology.

A clipper circuit is used to clip the maximum voltage or current of a signal. A soft clipper, rather than imposing a fixed maximum level, reduces the slope of the transfer function at a specified knee point.

One application for a clipper circuit would be in converting an analog signal into digital form, where it is desirable to limit the maximum value to be within the range of the analog-to-digital converter. The knee of the clipper circuit can be positioned either near the minimum or near the maximum position depending upon where the most significant data may be found.

Clipper circuits have been implemented in Bipolar or BiCMOS processes. Typically, a knee point for varying the slope is set with a control voltage.

It would be desirable to have a circuit which could implement a soft clipper in CMOS technology.

SUMMARY OF THE INVENTION

The present invention provides a soft clipper circuit in CMOS technology. The circuit not only allows the knee to be programmed, but also allows the slope of the curve after the knee to be programmed. This is accomplished by putting a second transconductance in parallel with a first transconductance, and using a switching circuit to connect the output of the second transconductance to that of the first transconductance when the knee level is reached. This is determined by a comparator which has an input coupled to the second transconductance and controls a control node of the switching circuit.

The invention is preferably implemented in current mode, with the current output of the second transconductance being converted to a voltage for the comparator input. By using this same current to both connect to the output and do the comparison function, offsets at the switching point are avoided.

The present invention also preferably includes a scaling circuit connected to the output of the second transconductance for varying its slope after the knee value is reached. The scaling circuit is preferably a current mirror.

For a further understanding of the nature and advantages of the invention, reference should be made to the following description taken in conjunction with the accompanying drawings.

DESCRIPTION OF THE PREFERRED EMBODIMENT

Figure 1:
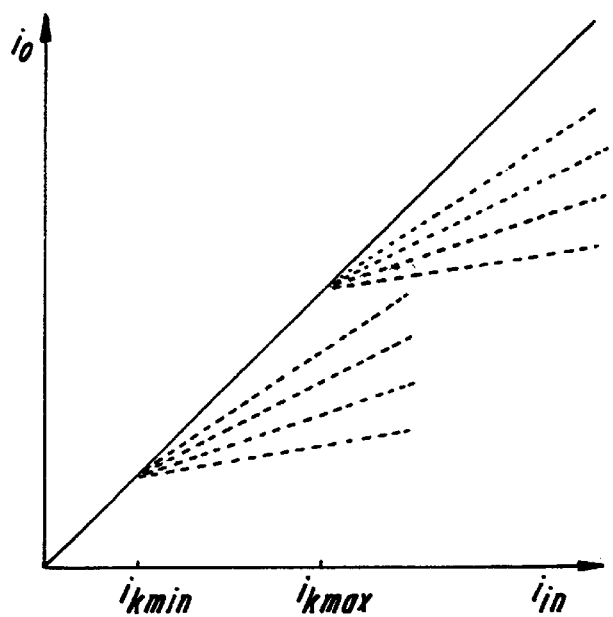
FIG. 1 is a graph of the transfer function of the soft clipper according to the invention.

FIG. 1 shows the required transfer function of the soft clipper (compressor) of the present invention. The solid line represents the transfer function without a soft clipper. The knee points can be programmed between the minimum value $i_{kmin}$ and the maximum value $i_{kmax}$. The soft clipper will change the slope of the transfer curve after the selected knee point. There are four possible transfer curves shown in the figure after the knee point. A control code supplied to the soft clipper selects one of the curves. The input and the output signals are shown in the current domain. However, it may also be implemented in the voltage domain or mixed domain (input voltage and output current).

Figure 2:
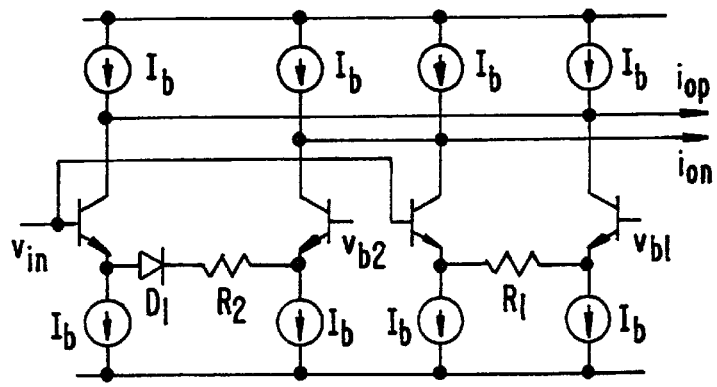
FIG. 2 is a circuit diagram of a prior art soft clipper using bipolar transistors.

In Bipolar or BiCMOS processes, we may use the switching characteristic of a diode to implement the required nonlinear transfer function. FIG. 2 shows the prior art implementation of a soft clipper by using bipolar transistors. The input signal is the single ended voltage $v_{in}$ and the output signal is the differential current $i_o = i_{op} - i_{on}$. The soft clipper has two transconductors controlled by the input signal. If we assume that the transconductance of the bipolar transistors is much larger than that of the resistors, then the transconductances of the transconductors are determined by the resistors and the bias condition of the diode. The knee voltage is set by the diode D1, resistor $R_2$ and $v_{b2}$. $v_{b1}$ is the zero signal reference. When the input voltage is smaller than the knee voltage, the diode D1 is off so that the transconductor provided by $D_1$ and $R_2$ is off. The slope of the transfer curve of the soft clipper is equal to the transconductance $1/R_1$. When the input voltage exceeds the knee voltage, the diode is turned on so that the transconductance of the combined transconductor is $1/R_1 - 1/R_2$. The position of the knee voltage can be varied by changing the bias voltage $v_{b2}$. However, the slope of the transfer curve after the knee point can not be easily adjusted. The soft clipper implemented in bipolar technology did not provide variable slope of the transfer curve. In a digital CMOS process, there is no diode available to implement a circuit similar to that shown in FIG. 2. Therefore, there is a need to invent a new CMOS circuit to implement the required function.

Figure 3:
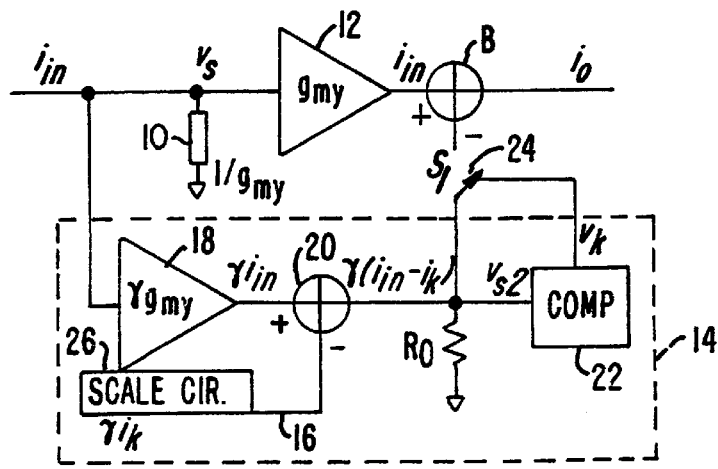
FIG. 3 is a functional diagram of the soft clipper according to the invention.

FIG. 3 shows a functional diagram of the CMOS soft clipper of this invention. There are two signal paths connected in parallel. One signal path is implemented by a current mirror which consists of a diode connected transconductor 10 ($1/g_{my}$) and the transconductor 12 ($g_{my}$) The other signal path shown in the dotted box 14 implements the required nonlinear function. A scaling circuit 26 produces a scaled knee current $\gamma i_{in}$ output from transconductor 18. The difference of the knee current and signal current from transconductor 18 at node 20 is converted into voltage signal $v_{s2}$ by a large resistor $R_0$. The following voltage comparator 22 generates a voltage signal $v_k$ which indicates the sign of $v_{s2}$. The output of the comparator ($v_k$) controls the switch 24 (S1) so that the output current $i_o$ described by the following equation is implemented.

$$i_o = \begin{cases} i_{in} & i_{in} < i_k \\ i_{in} - \gamma(i_{in} - i_k) & i_{in} \geq i_k \end{cases} \quad (1)$$

Figure 4:
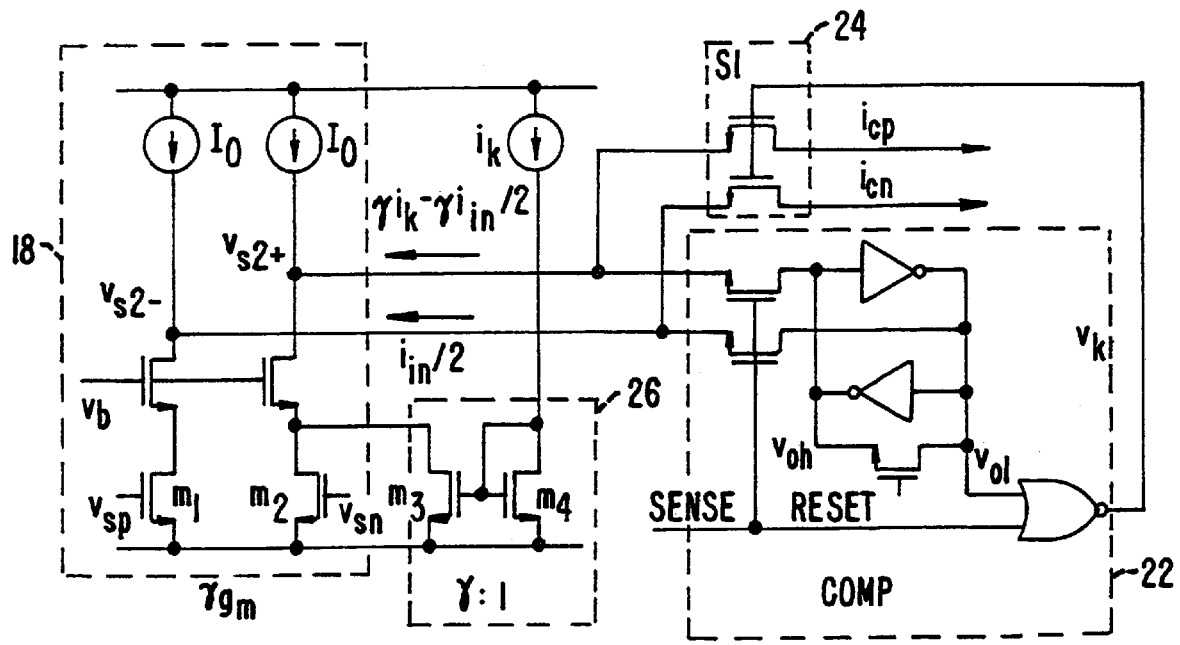
FIG. 4 is a circuit diagram of the non-linear signal path portion of the circuit of FIG. 3.

FIG. 4 shows a transistor implementation of the nonlinear signal path 14 of FIG. 3. Transistors $m_1$ and $m_2$ implement the $\gamma g_{my}$ block 18 along with the shown current sources in other transistors, and other elements not shown in order to avoid cluttering the diagram. Signals $V_{sp}$ and $V_{sn}$ correspond to a differential version of the input represented by $I_{in}$ of FIG. 3. The knee current is scaled by a current mirror ($m_3$ and $m_4$). The resistor $R_0$ shown in FIG. 3 represents the output resistance at the nodes $v_{s2+}$ and $v_{s2-}$. Two control signals (sense and reset) are needed to operate the comparator and to switch the differential signal current $\gamma(i_{in} - i_k)$ to the output.

Figure 5:
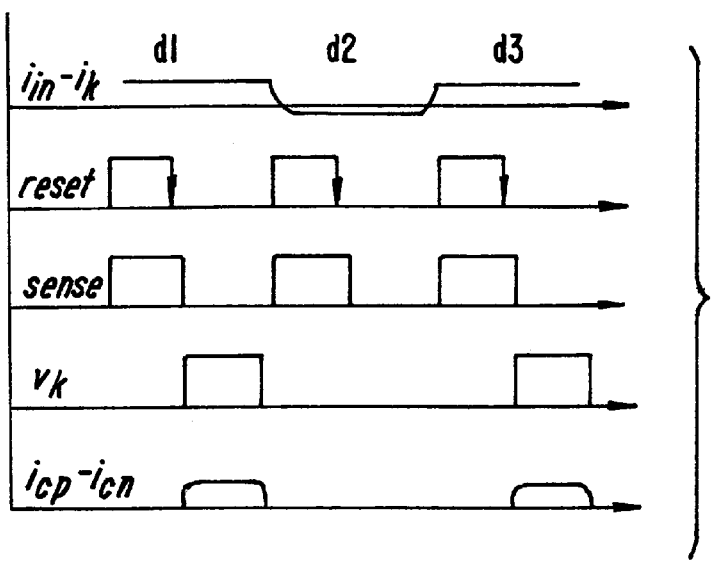
FIG. 5 is a timing diagram illustrating various waveforms of FIG. 4.

FIG. 5 shows the signal current, the control clocks, the output of the comparator, and the differential output current.

Three pixel values are displayed in FIG. 5. The first and the third pixel values are larger than the knee point.

When reset and sense are high, the comparator is in reset mode. The nodes $v_{oh}$ and $v_{ol}$ are shortended and in low impedance mode. $v_{s2+}$ and $v_{s2-}$ are connected to the $v_{oh}$ and impedance nodes and are in positive feedback mode (comparison mode). The initial unbalance of these two nodes will trigger the outputs such that one goes to power and the other one goes to ground. Therefore, the falling edge of the sense clock needs to be delayed relative to that of the reset clock to set the initial unbalance of the comparator. The low level of the sense clock also enables the NOR gate to pass the comparison result. If $i_{in}-i_k>0$, $v_k$ becomes high during the low interval of the sense clock. This signal will turn on the switches so that the differential current used for comparison is to be subtracted from the original copy of the signal current.

Figure 6:
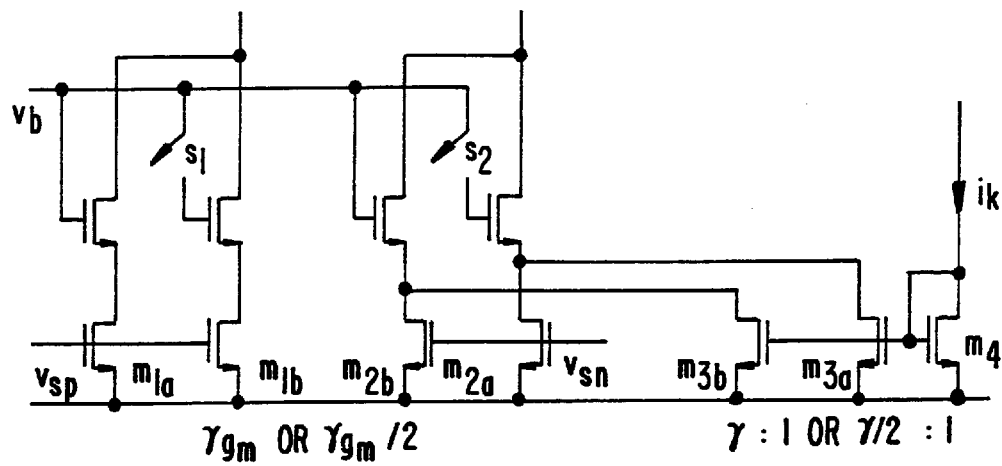
FIG. 6 is an example circuit diagram of the programmable slope circuit.

The position of the knee can be varied by programming the knee current $i_k$, which may be controlled by a DAC. The slope of the transfer curve after the knee point is 1–γ. It can be varied by changing the value of γ. FIG. 6 shows a simple circuit used to change γ. In this example, the value of the slope can be changed between 1–γ ($s_1$ and $s_2$ are closed) and 1–γ/2 ($s_1$ and $s_2$ are open). Using this scheme, the number of available slopes can be increased easily by adding more devices. Thus, the soft clipper of this invention can be programmed to provide variable knee position and slopes of the transfer curve after the knee point.

Figures 7A, 7B:
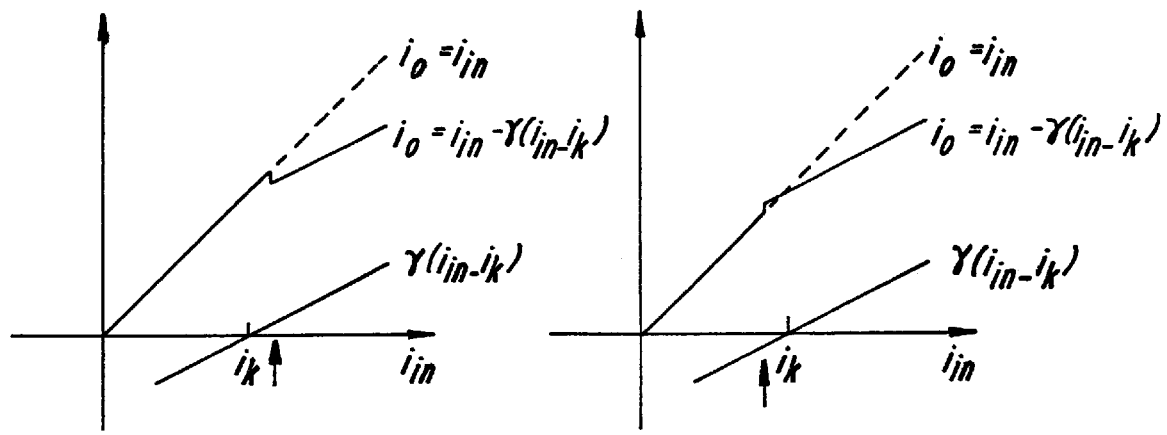
FIGS. 7A and 7B are graphs illustrating the problem of a mismatch of the comparison current and correction current.

The major advantage of this circuit implementation is that the same signal current ($\gamma i_{in}-i_k$) is used for both the comparison and output adjustment current. Therefore, the non-monotonicity of the transfer curve around the knee point is minimized. This point can be explained more clearly with the aid of FIG. 7. Since the nonlinear transfer function is implemented by subtracting a current from the original copy, the transfer curves shown in FIG. 7 may occur if the subtracting current is not the same as the comparison current or the comparator has a large offset voltage. FIGS. 7A–7B show the effect of switching of the correction current after (before) its zero crossing point. By using the schematic of FIG. 4, the error caused by the mismatch between the comparison current and the correction current is eliminated. The only error source which may cause these problems is the offset voltage of the comparator. This error source may be reduced by increasing the value of $R_0$ shown in FIG. 3 so that the minimum current step of $i_{in}$ will generate a voltage much larger than the offset voltage of the comparator. The minimum current step is determined by 1LSB output voltage divided by the equivalent resistance of the following transimpedance amplifier (I to V block).

As will be understood by those of skill in the art, the present invention may be embodied in other specific forms without departing from the spirit or essential characteristics thereof. Accordingly, the following description is intended to be illustrative, but not limiting, of the scope of the invention which is set forth in the following claims.

What is claimed is:

1. A CMOS soft clipper circuit comprising:
   a first transconductance coupled between an input node and an output node;
   a second transconductance having an input coupled to said input node;
   a comparator having an input coupled to an output of said second transconductance;
   a switching circuit coupled between said output of said second transconductance and said output node, such that said output of said second transconductance is connected to both said input of said comparator and said switching circuit; and
   an output of said comparator coupled to a control input of said switching circuit to activate said switching circuit when a value at said input to said comparator exceeds a knee value.

2. The circuit of claim 1 further comprising:
   a scaling circuit coupled to said output of said second transconductance for varying a slope of a transfer curve after said knee value is exceeded.

3. The circuit of claim 2 wherein said scaling circuit comprises a current mirror.

4. The circuit of claim 1 further comprising:
   a resistance coupled to said input of said comparator for converting a current output of said second transconductance output to a voltage.

5. The circuit of claim 1 wherein said first transconductance comprises a current mirror.

6. The circuit of claim 1 wherein said input and output nodes comprise differential current lines.

7. The circuit of claim 1 wherein said comparator includes sense and reset inputs for allowing a reset.

8. The circuit of claim 1 wherein an output signal from said second transconductance output is a current, with said current being provided to both said output node through said switching circuit only when said switching circuit is activated and to said input to said comparator for activation of said switching circuit.

9. A CMOS soft clipper circuit comprising:
   a first transconductance coupled between an input node and an output node;
   a second transconductance having an input coupled to said input node;
   a comparator having an input coupled to an output of said second transconductance;
   a switching circuit coupled between said output of said second transconductance and said output node;
   an output of said comparator coupled to a control input of said switching circuit to activate said switching circuit when a value at said input to said comparator exceeds a knee value;
   a scaling circuit coupled to said output of said second transconductance for varying a slope of a transfer curve after said knee value is exceeded; and
   a resistance coupled to said input of said comparator for converting a current output of said second transconductance output to a voltage;
   wherein said output current is provided to both said output node through said switching circuit only when said switching circuit is activated and said input to said comparator for activation of said switching circuit.

10. The circuit of claim 9 wherein said first transconductance comprises a current mirror.

11. The circuit of claim 9 wherein said input and output nodes comprise differential current lines.

12. The circuit of claim 9 wherein said comparator includes sense and reset inputs for allowing a reset.

13. The circuit of claim 9 wherein said scaling circuit comprises a current mirror.

* * * * *